(12) United States Patent
Phaneuf et al.

(10) Patent No.: US 8,466,415 B2
(45) Date of Patent: Jun. 18, 2013

(54) METHODS FOR PERFORMING CIRCUIT EDIT OPERATIONS WITH LOW LANDING ENERGY ELECTRON BEAMS

(75) Inventors: Michael William Phaneuf, Ottawa (CA); Ken Guillaume Lagarec, Gatineau (CA); Alexander Krechmer, Nepean (CA)

(73) Assignee: Fibics Incorporated, Ottawa, Ontario (CA)

( * ) Notice: Subject to any disclaimer, the term of this patent is extended or adjusted under 35 U.S.C. 154(b) by 723 days.

(21) Appl. No.: 12/092,783

(22) PCT Filed: Nov. 7, 2006

(86) PCT No.: PCT/CA2006/001816
§ 371 (c)(1),
(2), (4) Date: May 16, 2011

(87) PCT Pub. No.: WO2007/051313
PCT Pub. Date: May 10, 2007

(65) Prior Publication Data
US 2011/0204263 A1 Aug. 25, 2011

Related U.S. Application Data

(60) Provisional application No. 60/733,812, filed on Nov. 7, 2005.

(51) Int. Cl.
*H01L 21/46* (2006.01)
*H01J 37/26* (2006.01)
(52) U.S. Cl.
USPC ........... 250/305; 250/306; 250/309; 250/310; 250/311

(58) Field of Classification Search
USPC .......................... 250/305, 306, 309, 310, 311
See application file for complete search history.

(56) References Cited

U.S. PATENT DOCUMENTS 4,530,734 A * 7/1985 Klima ............................ 216/87
(Continued)

FOREIGN PATENT DOCUMENTS

WO 9608036 3/1996

OTHER PUBLICATIONS

Scott, "Gas Chromatography", Butterworths, London, 1960, xvii + 466 pp. 95.

(Continued)

*Primary Examiner* — David A Vanore
(74) *Attorney, Agent, or Firm* — Shin Hung; Borden Ladner Gervais LLP

(57) ABSTRACT

Methods for using sub-100V electron beam landing energies for performing circuit edit operations. Circuit edit operations can include imaging for navigation and etching in the presence of a suitable gas. Low landing energies can be obtained by modifying a decelerator system of native FESEM equipment, or by using biasing means near the sample surface for decelerating electrons of the primary beam. At low landing energies near the operating voltage of a semiconductor circuit, voltage contrast effects can be visually seen for enhancing operator navigation. Low landing energies can be used during etching processes for minimizing the interaction volume of the beam and obtaining accurate and localized etching.

14 Claims, 18 Drawing Sheets

U.S. PATENT DOCUMENTS

| | | | |
|---|---|---|---|
| 5,789,748 A * | 8/1998 | Liu et al. | 250/310 |
| 6,806,198 B1 * | 10/2004 | Ring et al. | 438/706 |
| 6,900,447 B2 * | 5/2005 | Gerlach et al. | 250/494.1 |
| 7,256,405 B2 * | 8/2007 | Nakasuji et al. | 250/492.22 |
| 2004/0108458 A1 * | 6/2004 | Gerlach et al. | 250/311 |
| 2005/0072753 A1 | 4/2005 | Koops et al. | |
| 2011/0204263 A1 * | 8/2011 | Phaneuf et al. | 250/492.2 |

OTHER PUBLICATIONS

International Patent Application No. PCT/CA2006/001816, International Search Report dated Feb. 15, 2007.

PCT Patent Application No. PCT/CA2006/001816 International Preliminary Report on Patentability dated May 15, 2008.

* cited by examiner

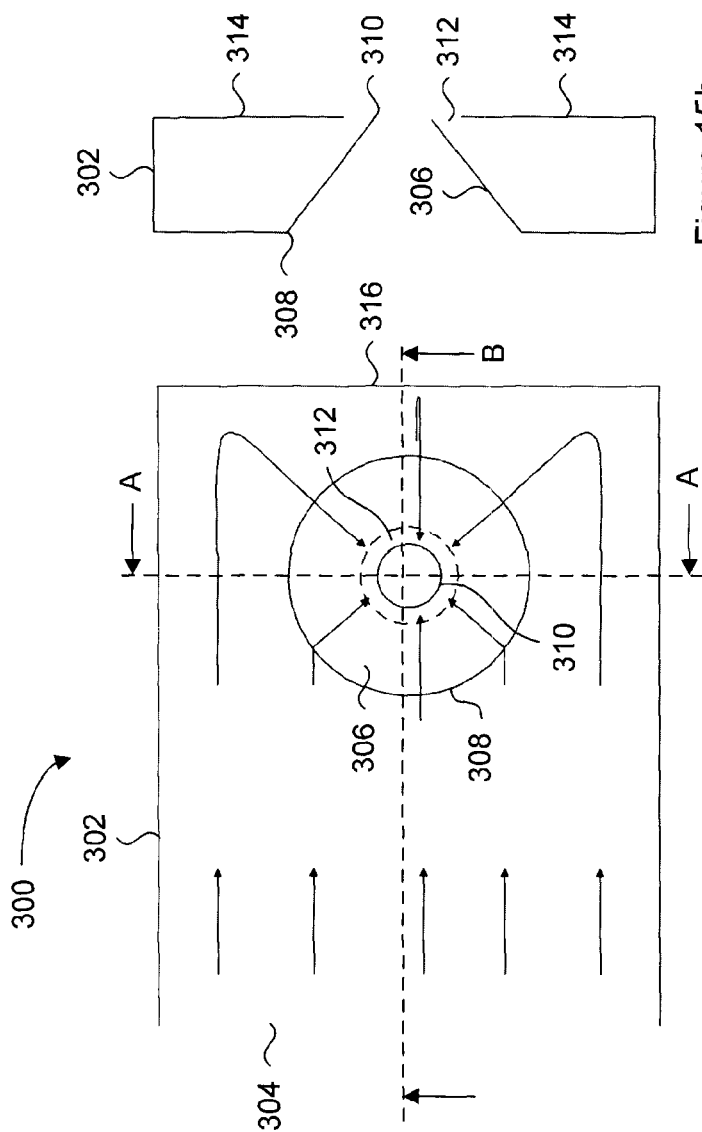
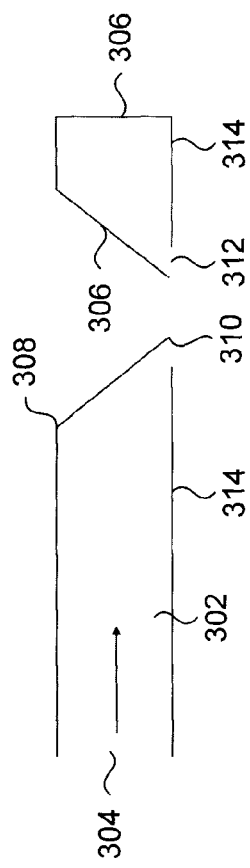
Figure 15a
Figure 15b
Figure 15c

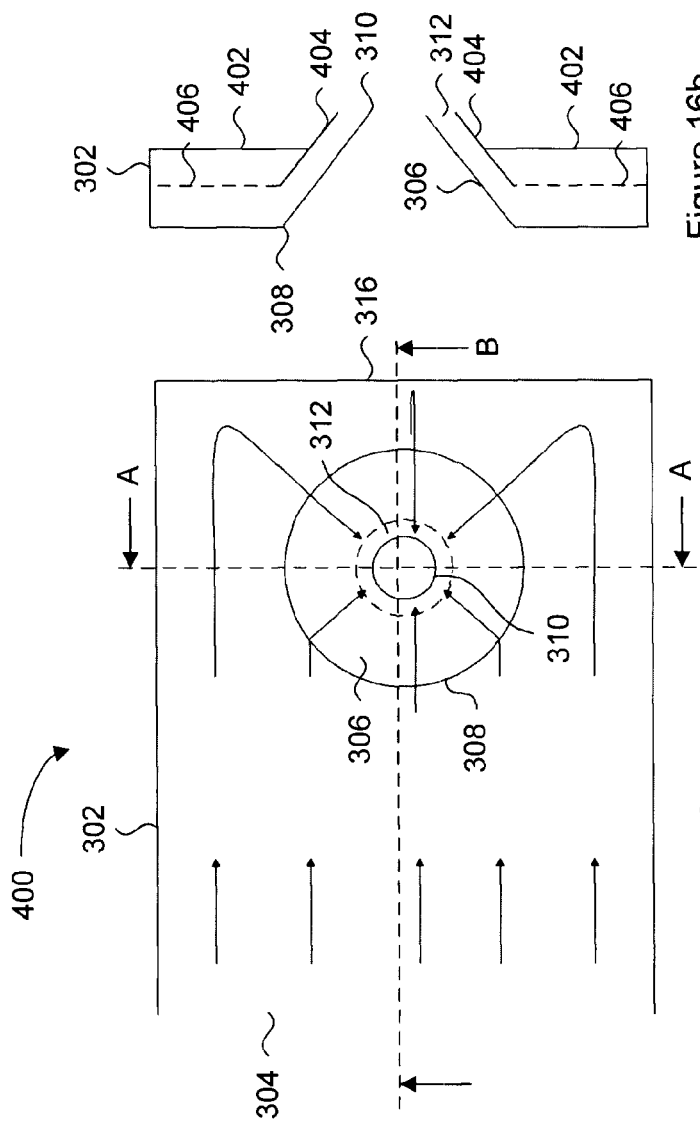
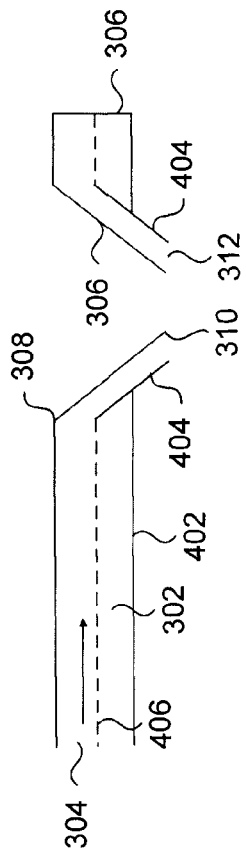
Figure 16a
Figure 16b
Figure 16c

METHODS FOR PERFORMING CIRCUIT EDIT OPERATIONS WITH LOW LANDING ENERGY ELECTRON BEAMS

FIELD OF THE INVENTION

The present invention generally relates to charged particle beam systems. In particular, the present invention relates to circuit edit operations using scanning electron microscopes (SEM's).

BACKGROUND OF THE INVENTION

Focused Ion Beam (FIB) microscope systems have been produced commercially since the mid 1980's, and are now an integral part of rapidly bringing semiconductor devices to market. FIB systems produce a narrow, focused beam of charged particles, and scan this beam across a specimen in a raster fashion, similar to a cathode ray tube. Unlike the scanning electron microscope, whose charged particles are negatively charged electrons, FIB systems use charged atoms, hereinafter referred to as ions, to produce their beams. These ions are, in general, positively charged.

These ion beams, when directed onto a semiconductor sample, will eject secondary electrons, secondary ions ($i^+$ or $i^-$), and neutral molecules and atoms from the exposed surface of the sample. By moving the beam across the sample and controlling various beam parameters such as beam current, spot size, pixel spacing, and dwell time, the FIB can be operated as an "atomic scale milling machine," for selectively removing, or sputtering, materials wherever the beam is placed. The dose, or amount of ions striking the sample surface, is generally a function of the beam current, duration of scan, and the area scanned. The ejected particles can be sensed by detectors, and then by correlating this sensed data with the known beam position as the incident beam interacts with the sample, an image can be produced and displayed for the operator.

FIG. 1 is a schematic of a typical FIB system. FIB system 10 includes an evacuated envelope 11 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward sample 22, which comprises, for example, a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum of approximately $1\times10E-7$ Torr. If an etch assisting gas, an etch retarding gas, a deposition precursor gas, or some other reactive or non reactive gas is used, the chamber background pressure may rise, typically to about $1\times10E-5$ Torr.

High voltage power supply 34 is connected to liquid metal ion source 14 and to appropriate electrodes in focusing column 16 and directing the ion beam. Deflection controller and amplifier 36, operated in accordance with a prescribed pattern provided by pattern generator 38, is coupled to deflection plates 20. A charged particle multiplier detector 40 detects secondary ion or electron emission for imaging, is connected to video circuit and amplifier 42, the latter supplying drive for video monitor 44 also receiving deflection signals from controller 36. A door 48 is provided for inserting sample 22 onto stage 24, which may be heated or cooled. Focused ion beam systems are commercially available from various companies, but the system shown in FIG. 1 represents one possible FIB system configuration.

During any beam raster operation executed by FIB system 10, which includes imaging, milling, gas assisted etching or deposition, the FIB beam deflection software and hardware deflects the beam in a preset pattern across the surface, generally referred to as rastering. At each preset location, the beam is left to dwell for a given period of time before moving to the next point in the raster. At its simplest, a raster pass consists of deflecting the beam at fixed increments along one axis from a start point to an end point, dwelling for a fixed dwell time at each point. At the end of a line, the beam waits a fixed retrace time before moving an increment in a second axis. The beam may return to the start point in the first axis and begin again, or may begin "counting down" the first axis from the point it had just reached (depending on whether the raster type is raster (the former) or serpentine (the latter). This process continues until all increments in both axes have occurred, and the beam has dwelled at all points in the scan.

It is well understood by those of skill in the art that FIB systems are used to perform microsurgery operations for executing design verification or to troubleshoot failed designs. This can involve physically "cutting" metal lines or selectively depositing metallic lines for shorting conductors together. Hence, FIB system technologies can enable prototyping and design verification in a matter of days or hours rather than weeks or months as re-fabrication would require. This FIB "rapid prototyping" is frequently referred to as "FIB device modification", "circuit editing" or "microsurgery." Due to its speed and usefulness, FIB microsurgery has become crucial to achieving the rapid time-to-market targets required in the competitive semiconductor industry.

The success of any FIB microsurgery operation depends on the precise control of the milling process, and the position on the semiconductor circuit at which milling is to occur. An unintentionally cut metal line, or deposition of material in the wrong area can render the semiconductor circuit defective. Current integrated circuits have multiple alternating layers of conducting material and insulating dielectrics, with many layers containing patterned areas. Hence it can be challenging for a FIB operator to identify the precise location where an operation is to occur, especially if the structure of interest resides underneath a layer of conducting and/or insulating material. Therefore, proper navigation through visual imaging of the semiconductor device is necessary. However, a FIB is not an ideal means for generating images for navigation due to its inherent destructive process and surface sensitive nature.

Field emission scanning electron microscopes (FESEM) on the other hand, utilize and electron beam for imaging materials. FIG. 2 is an illustration of a typical electron beam system.

The electron beam system of FIG. 2 includes an electron beam column 60, a specimen vacuum chamber 62, a reactant material delivery system 64, and a user control station 66. An electron beam 68 is emitted from a cathode 70 by applying voltage between cathode 70 and an anode 72. Electron beam 68 is focused to a fine spot by means of a condensing lens 74 controlled by a condensing lens control circuit in user control station 66 and an objective lens 76 controlled by an objective lens control circuit in user control station 66. Electron beam 68 is scanned two-dimensionally on the specimen by means of a deflection coil 78 controlled by a deflection control circuit in user control station 66. Electron beam 68 is focused onto a work piece 80. Work piece 80 is located on a movable stage 82 within the specimen vacuum chamber 62. The specimen vacuum chamber 62 includes a secondary electron detector 84 for detecting secondary particles suitable for generating an image of the work piece.

The operation of secondary electron detector 84 is controlled by a control unit within user control station 66. Secondary electron detector 84 is also connected to an amplifier (not shown). The amplified signals are converted into digital signals and subjected to signal processing by a signal processor for providing a resulting digital signal which is used by a CPU, to display an image of the work piece 80 on a monitor. The reactant material delivery system 64 includes a reservoir connected to a delivery conduit 86 for delivering reactant materials to the surface of work piece 80. It is noted that most commercially available FESEM machines do not have gas delivery systems, however, dual beam systems (incorporating FIB and SEM columns in the same chamber) will inherently have a gas delivery system for supporting FIB circuit etch and deposition operations.

Electrons essentially cannot sputter material on their own because the momentum of an electron in a typical electron beam is not sufficient to remove molecules from a surface by momentum transfer. The amount of momentum that is transferred during a collision between an impinging particle and a substrate particle depends not only upon the momentum of the impinging particle, but also upon the relative masses of the two particles. Maximum momentum is transferred when the two particles have the same mass. When there is a mismatch between the mass of the impinging particle and that of the substrate particle, less of the momentum of the impinging particle is transferred to the substrate particle. A gallium ion used in focused ion beam milling has a mass of over 130,000 times that of an electron. In a typical focused ion beam system, the gallium ions are accelerated through a voltage of 25-50 kV, whereas the electrons in a scanning electron microscope are typically accelerated through a voltage of 1 kV to 30 kV, but most often at 5 kV. The momentum transfer of a typical 30 kV gallium ion impinging on a copper substrate in a FIB system is therefore greater than 1000 times that of a 5 kV electron in an electron microscope.

An electron beam will not etch in the absence of a chemical etchant, whereas an ion beam will always sputter material, even though sputtering may be enhanced or attenuated in the presence of a gas. Therefore, an electron beam cannot be used to etch a particular material unless a specific chemical is used that will etch the material in the presence of the electron beam. Furthermore, the specific chemical may not significantly etch the material in the absence of electron beam. The use of electron beams to etch a variety of materials in the presence of specific chemicals is known the art.

When a primary electron beam is directed onto a sample, the electrons impinging on the sample react with the sample and cause electrons to emanate from the sample. According to the characteristics of the sample at the position at which the primary electron beam impinges thereupon, more or less electrons will, at constant primary electron beam intensity, emanate from the sample. From an examination of the intensity of the electrons emanating from the sample in dependence of the location, at which the primary electron beam impinges on the sample, images may be obtained.

The electrons emanating from the sample are generated by the electrons of the primary electron beam through different physical effects. These effects can include the generation of back scattering electrons, which according to a common definition have an energy of more than 50 eV and are abbreviated BSE; the generation of electrons which have an energy of less than 50 eV and are termed secondary electrons in the narrower sense. These are discriminated into secondary electrons abbreviated SE1, which are generated near the surface of the sample by an impinging primary electron. Secondary electrons abbreviated SE2 can be generated by back scattering electrons emanating from the sample near the sample's surface; the generation of electrons of the primary electron beam, which do not quite reach the surface of the sample but are reflected just before the sample's surface due to a charging of the sample and are commonly referred to as mirror electrons; and the generation of transmission electrons, which are primary electrons traversing the sample and scattered primary electrons and secondary electrons emanating from the sample in a direction of the primary electron beam. Auger electrons can also be emitted from the sample.

Therefore, in addition to the use of FESEM's for non-destructive imaging and navigation of a semiconductor device, they can be used in the presence of an appropriate gas for selective etching of materials. By example, U.S. Patent Application Publication No. 2005/0072753A1 filed on Jul. 28, 2003 by Koops et al., describes a method for etching photo-masks and stencil masks that are used for semiconductor device fabrication patterning. Koops et al. uses an electron beam having a landing energy between 100 eV and 200 keV, with a beam resolution of 2 nm under typical conditions.

However, the relatively high landing energies of the electron beam may not be suitable for FESEM gas assisted etching of semiconductor circuits. Ideally, gas breakdown is more efficient at low landing energies of the electron beam. Those skilled in the field of low energy electron ionization sources used in gas chromatography and mass spectrometry, understand that broad beam electron impact ionization sources are optimized for ~70 eV energy, however lower energies are often useful for providing more selective dissociation of the gas phase products. This is described in Gas Chromatography, 1960 R. P. W. Scott (Editor), Butterworths, London, 1960, xvii+466 pp., 955, an excerpted which is available on the Internet at http://www.chromatography-online.org/GC-Tandem/GC-MS/Ion-Generation/Electron-Impact-Ionization/rs65.html. Scott states that the electron energy that will provide optimum ionization varies between different compounds, but an average value appears to fall within the range of 50 and 100 eV.

Unfortunately, there are very few FESEMs which can provide low landing energy electron beams. The Hitachi High Technologies model 4800 and the Carl Zeiss SMT Ultra 55 have been in production for a few years, and are designed to provide landing energies no lower than 100 V. This is still very far from the ~20 V expected energy of the secondary electrons emitted from focused ion beam interaction processes with the target substrate, and is still above the 20 eV to 70 eV ideal range for gas decomposition, as previously described.

It is, therefore, desirable to provide a system for generating electron beams with low landing energies, and a method for using these generated low landing energies for circuit edit operations.

SUMMARY OF THE INVENTION

It is an object of the present invention to obviate or mitigate at least one disadvantage of previous circuit edit methods using SEM's. In particular, it is an object of the present invention to employ electron beams having low landing energies for high accuracy circuit edit operations.

In a first aspect, the present invention provides a method for performing a circuit edit operation on a semiconductor device using an electron beam. The method includes directing the electron beam to a target area of the semiconductor device, and providing a reactive gas proximate to a surface of the semiconductor device. Preferably, the electron beam has a landing energy of less than 100V. According to an embodiment of the present invention, the landing energy of the electron beam is set to have an optimal energy for disassociating the reactive gas. According to further embodiments of the present aspect, the landing energy of the electron beam is reduced to a level of less than 100V by electrically biasing an element proximate to the semiconductor device to provide a concentric electric field for decelerating the electron beam. The element can be a gas nozzle for delivering a gas to the semiconductor device.

In a second aspect, the present invention provides a method for performing a circuit edit operation of a semiconductor device using an electron beam. The method includes positioning the electron beam onto a target edit area of the semiconductor device; setting the landing energy of the electron beam to less than 100V; and providing a reactive gas proximate to a surface of the semiconductor device. In a first embodiment of the present aspect, the landing energy of the electron beam is set to have an optimal energy for disassociating the reactive gas. In another embodiment of the present aspect, the step of positioning the semiconductor device includes setting a landing energy proximate to an operating voltage of the semiconductor device.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 15a to 15c are schematics of a gas delivery nozzle according to an embodiment of the present invention;

FIGS. 16a to 16c are schematics of a gas delivery nozzle according to an alternate embodiment of the present invention;

DETAILED DESCRIPTION

Generally, the present invention provides methods for using sub-100 eV electron beam landing energies for performing circuit edit operations. Circuit edit operations can include imaging for navigation and etching in the presence of a suitable gas. Low landing energies can be obtained by modifying a decelerator system of native FESEM equipment, or by using biasing means near the sample surface for decelerating electrons of the primary beam. At low landing energies near the operating voltage of a semiconductor circuit, voltage contrast effects can be visually seen for enhancing operator navigation. Low landing energies can be used during etching processes for minimizing the interaction volume of the beam and obtaining accurate and localized etching.

The following embodiments of the present invention are preferably used in FESEM machines designed for generating low landing energy electron beams. At the present time, there are no FESEM machines which have this capability. However, it is possible that future FESEM machines with this capability will be available.

The nature of the invention has been discovered with the aid of simulations of electrons impinging on a silicon sample. FIGS. 3 to 8 are CASINO simulations of electron beams having various landing energies, and their corresponding behavior in the silicon target material. CASINO is a Monte Carlo simulation of electron trajectory in solids specially designed for low beam interaction in a bulk and thin foil. This complex single scattering Monte Carlo program is specifically designed for low energy beam interaction and can be used to generate many of the recorded signals (x-rays and backscattered electrons) in a scanning electron microscope. This program can also be efficiently used for all of the accelerated voltages found on a field emission scanning electron microscope (0.1 to 30 KeV), as well as for simulating lower primary energies. CASINO is produced by the Universite de Sherbrooke, Sherbrooke, Quebec, Canada.

Figure 1:
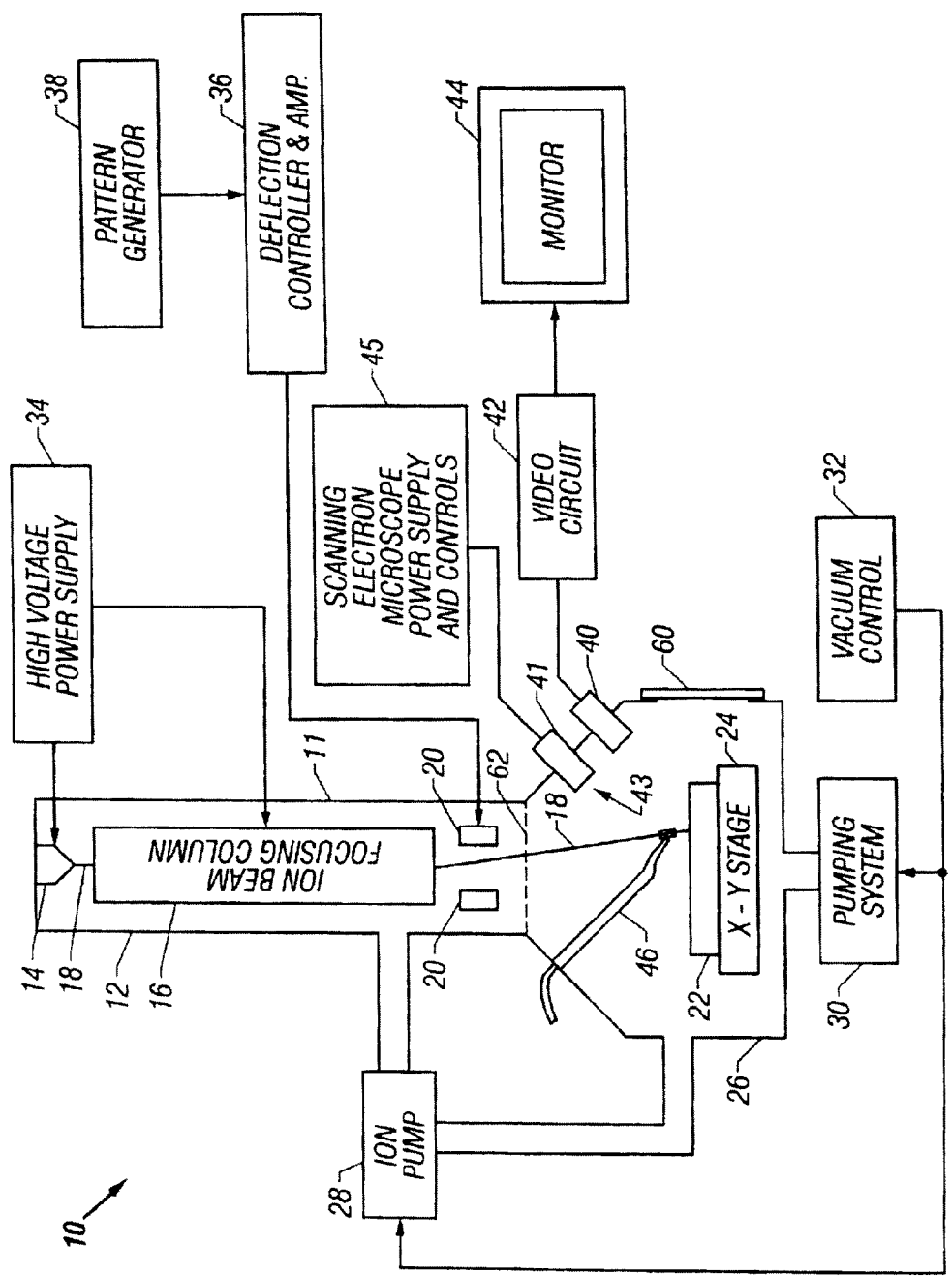
FIG. 1 is a schematic of a FIB system of the prior art.
Figure 2:
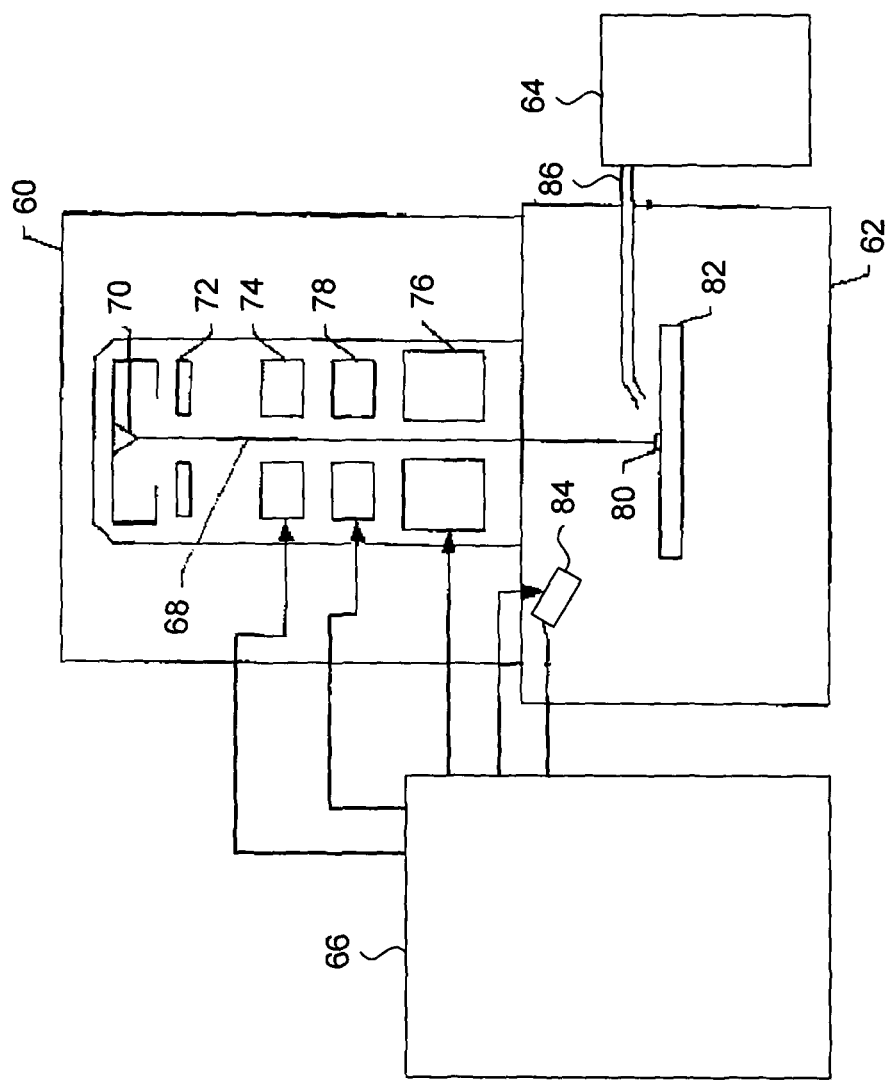
FIG. 2 is a schematic of an SEM system of the prior art.
Figure 3:
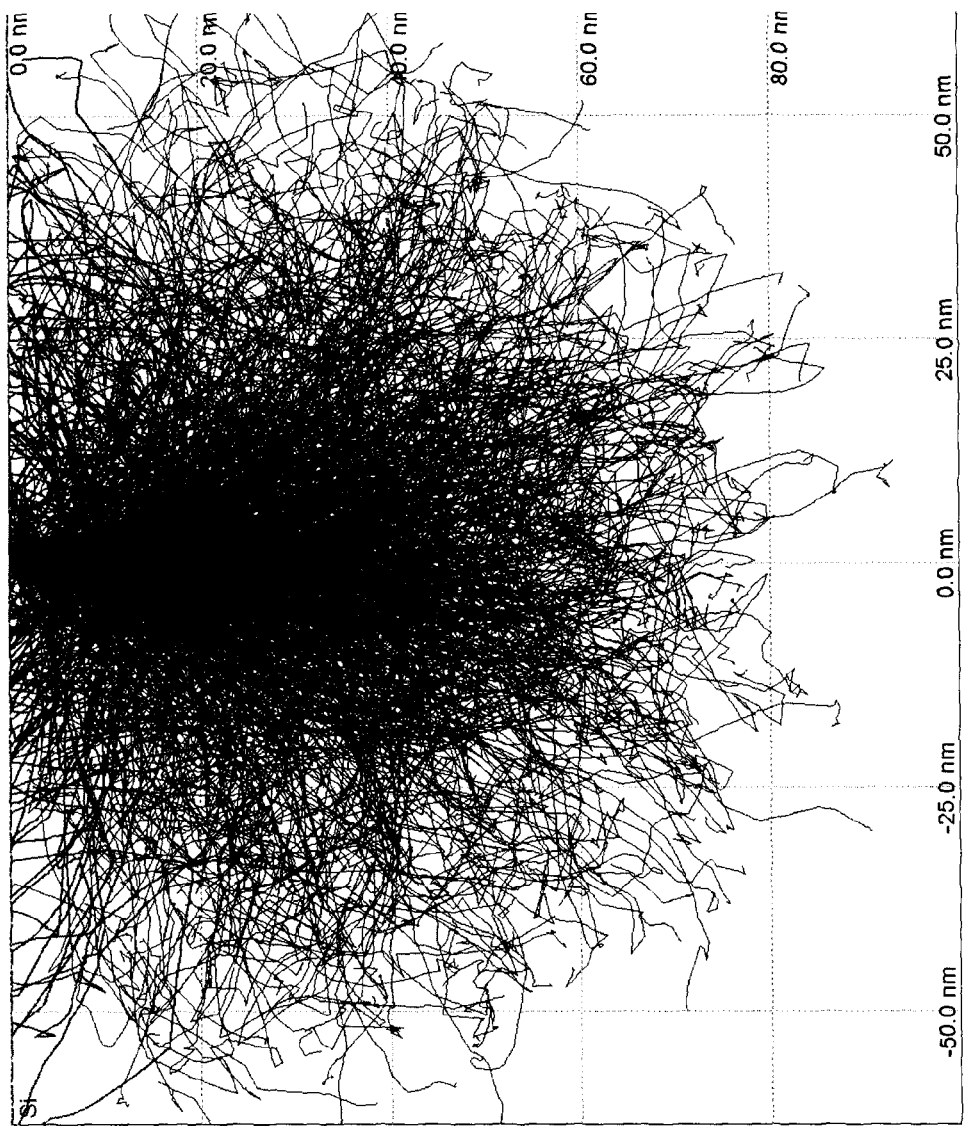
FIGS. 3 to 8 are simulation plots of electron trajectories in silicon at various electron beam landing energies.

FIG. 3 shows a simulation of a 2000V electron beam having a 1 nm beam diameter incident on the target surface. The vertical axis represents a depth in nm of a silicon sample, while the horizontal axis represents a width in nm of a silicon sample. The simulation parameter of 1000 electrons being simulated into silicon with electron trajectories no longer tracked once they fall below 30 eV was applied. It is noted that the region of re-emitted electrons, meaning those that return to the surface of the sample, can cause gas decomposition, covers a regions in excess of 100 nm wide. This means that an area 100 nm wide can be etched or deposited on (in the presence of a suitable gas), when the desired area is only 1 nm wide.

Figure 4:
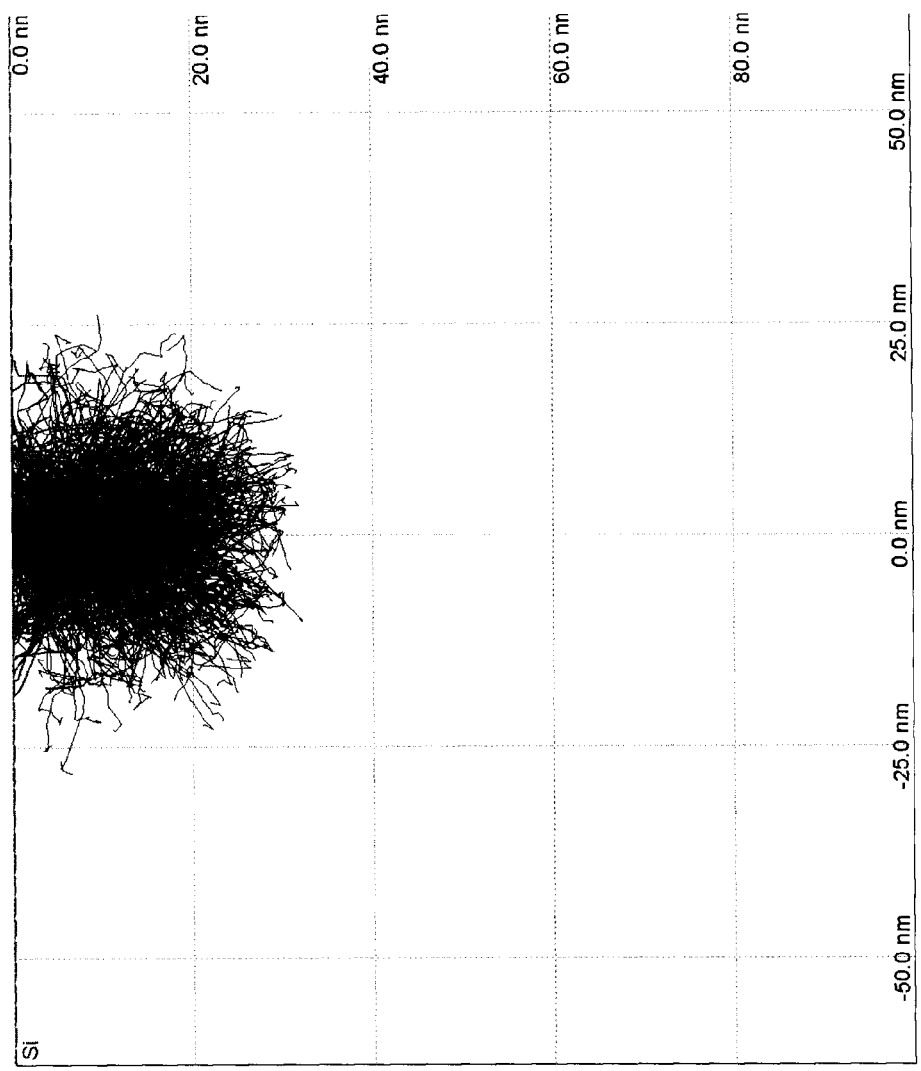

FIG. 4 shows a simulation of a 1000 V electron beam having a 1 nm beam diameter incident on the target surface. The same vertical and horizontal axis units are used, and the same simulation parameters have been applied. In FIG. 4, the region of re-emitted electrons, all of which could cause gas decomposition, is in excess of 25 nm wide.

Figure 5:
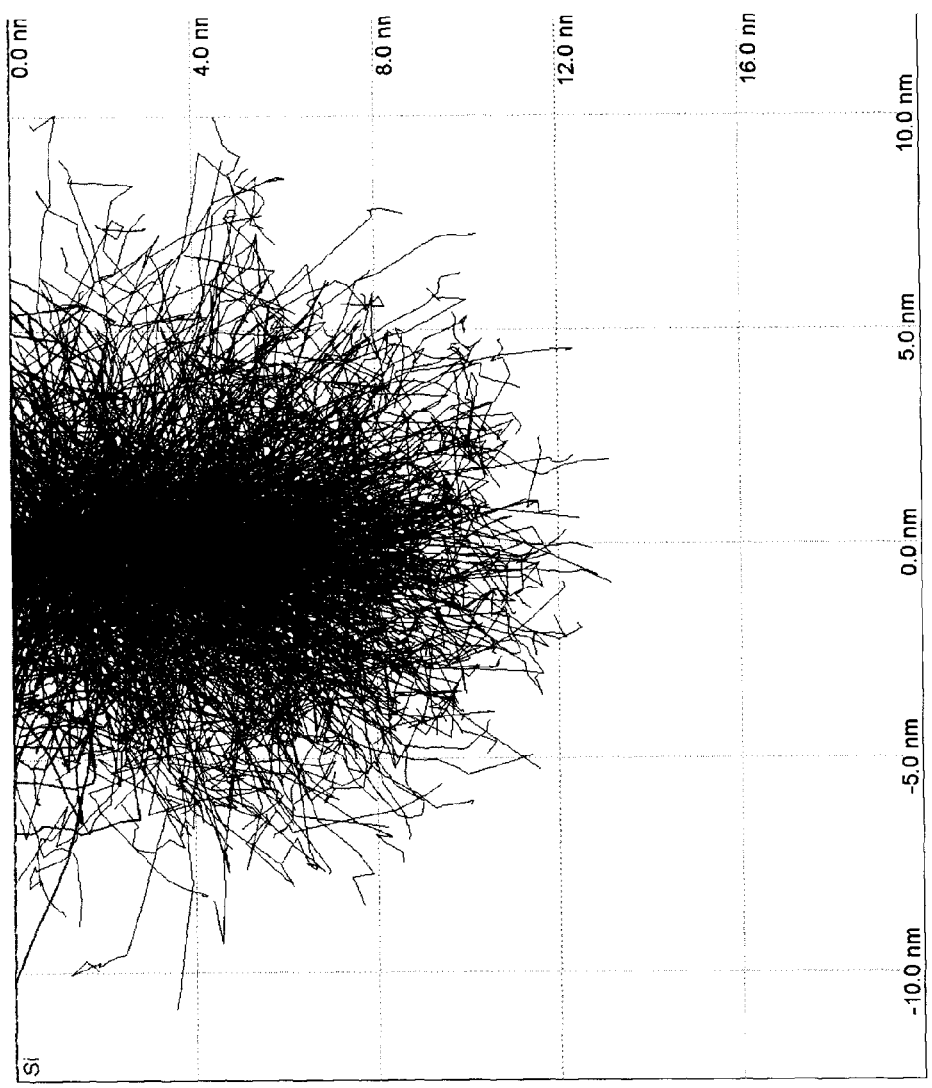

FIG. 5 shows a simulation of a 500 V electron beam having a 1 nm beam diameter incident on the target surface. The vertical and horizontal scale is 5 times smaller than in FIG. 4, and the same simulation parameters have been applied. In FIG. 5, the region of re-emitted electrons, all of which could cause gas decomposition, is in excess of 15 nm wide.

Those skilled in the art will realize that the number of secondary electrons will not be evenly distributed across the shown profiles, and will tend to a concentrate near the beam diameter. However, sufficient numbers of electrons will be distributed across the sample space away from the beam to potentially cause adverse effects, such as undesired etching or deposition. The probability of having secondary electrons travel further from the incident beam will increase as the landing energy of the beam is increased.

Figure 6:
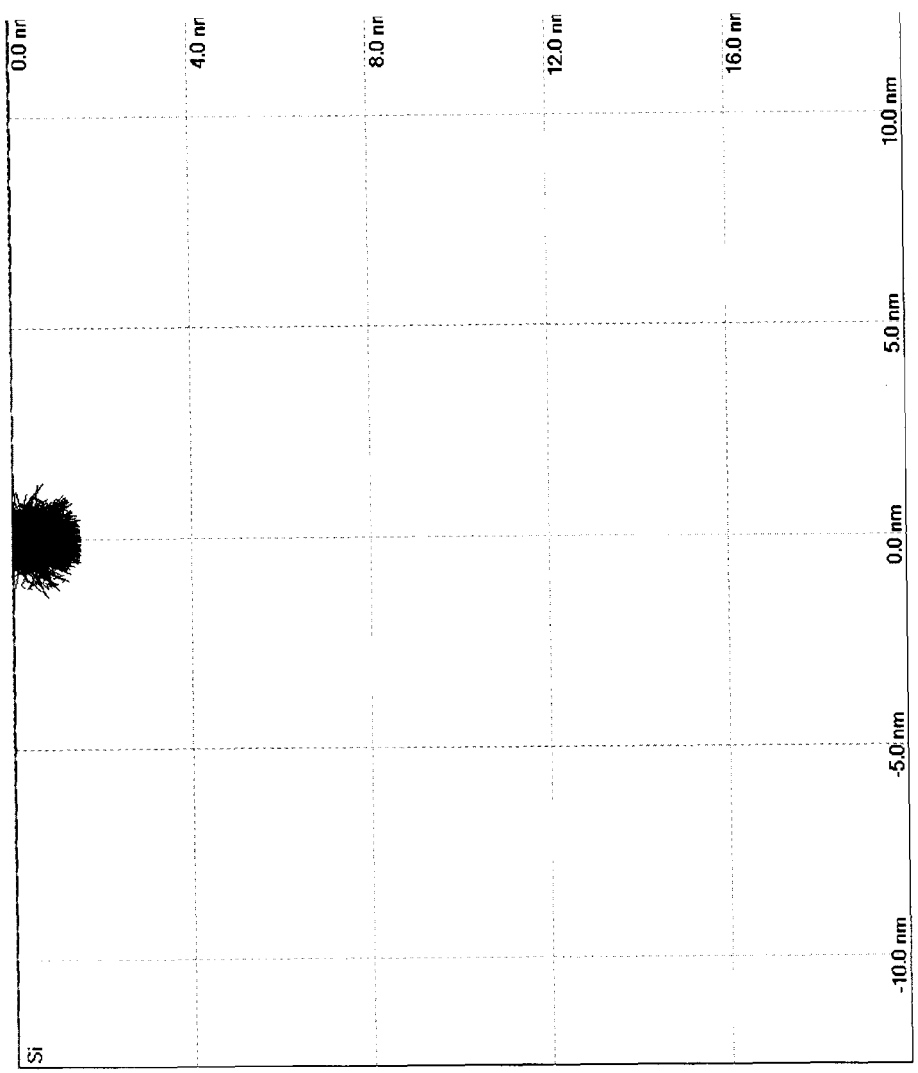

FIG. 6 shows a simulation of a 99 V electron beam having a 1 nm beam diameter incident on the target surface. The vertical and horizontal scale is 5 times smaller than in FIG. 4, and the same simulation parameters have been applied. In FIG. 6, the region of re-emitted electrons, all of which could cause gas decomposition, is less than 4 nm wide. Hence, this simulation demonstrates a significant improvement in interaction volume when the landing energy of the electron beam falls below 100 V.

Figure 7:
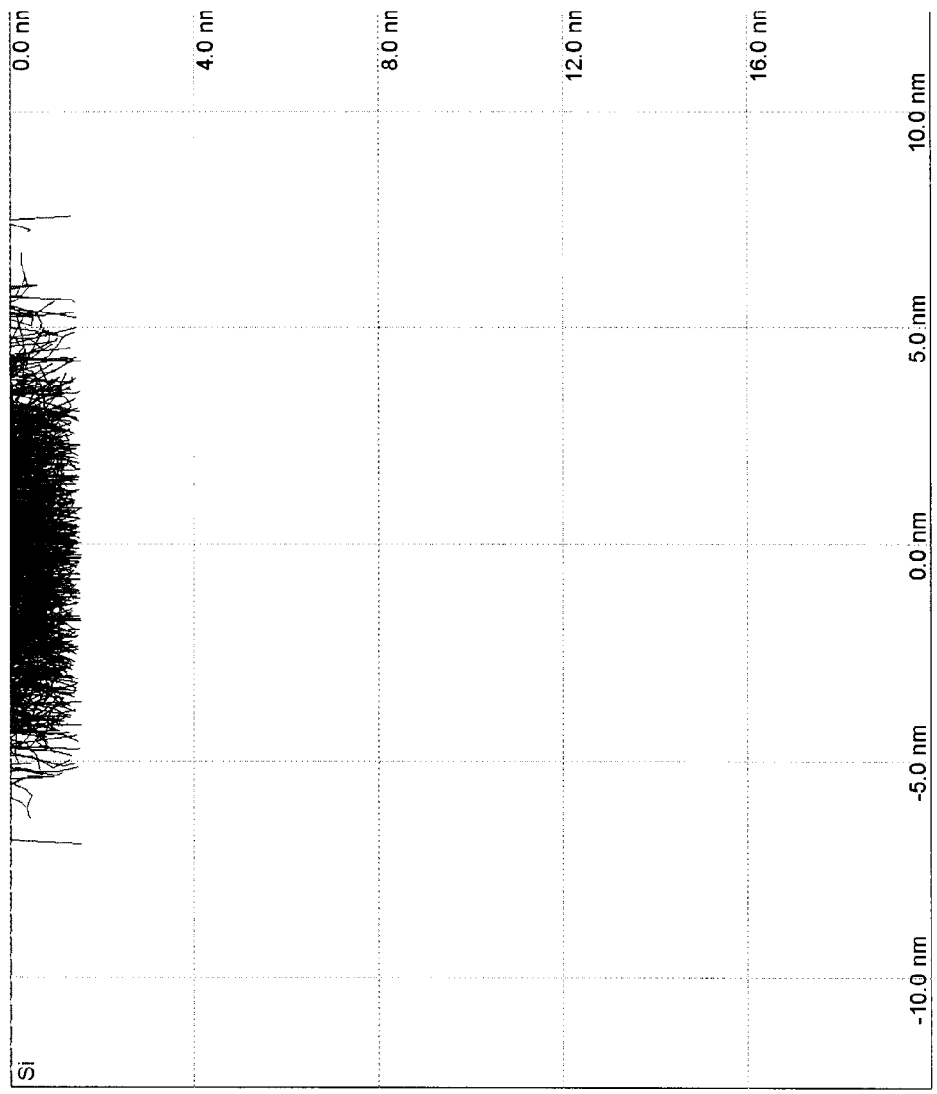

FIG. 7 shows a simulation of a 99 V electron beam having a 10 nm beam diameter incident on the target surface. Those skilled in the art will realize that at lower landing energies, broadening of the incident beam may occur, thus, the 10 nm beam diameter chosen for this simulation will account for loss of resolution due to low landing energy. The vertical and horizontal scale is 5 times smaller than in FIG. 4, and the same simulation parameters have been applied. In FIG. 7, the region of re-emitted electrons, all of which could cause gas decomposition, is less than 15 nm wide.

Those skilled in the art will realize that ideal conditions for gas assisted etching or deposition will rely on many parameters, not just landing energy. For example, it is well known from FIB circuit edit that obtaining optimal gas processes can depend on the selection of beam current and spot size, dwell time at each point the beam visits, the spacing between dwell points which can in some case be substantially larger than the spot size itself to yield optimal results, the "refresh time" that is allowed for gas flow to occur between events at which the beam revisits the same vicinity, the benefit of pulsing the beam to achieve different conditions such as annealing a deposited material using a second longer dwell time after a short dwell time has decomposed the material, the use of heating and cooling stages and or hot or cool physical probes, etc. and the moderation of the pressure and volume of the gas flow itself, as well as the choice of gas can all be optimized to further improve the quality of the deposition or etching that occurs with these low energy electrons.

Figure 8:
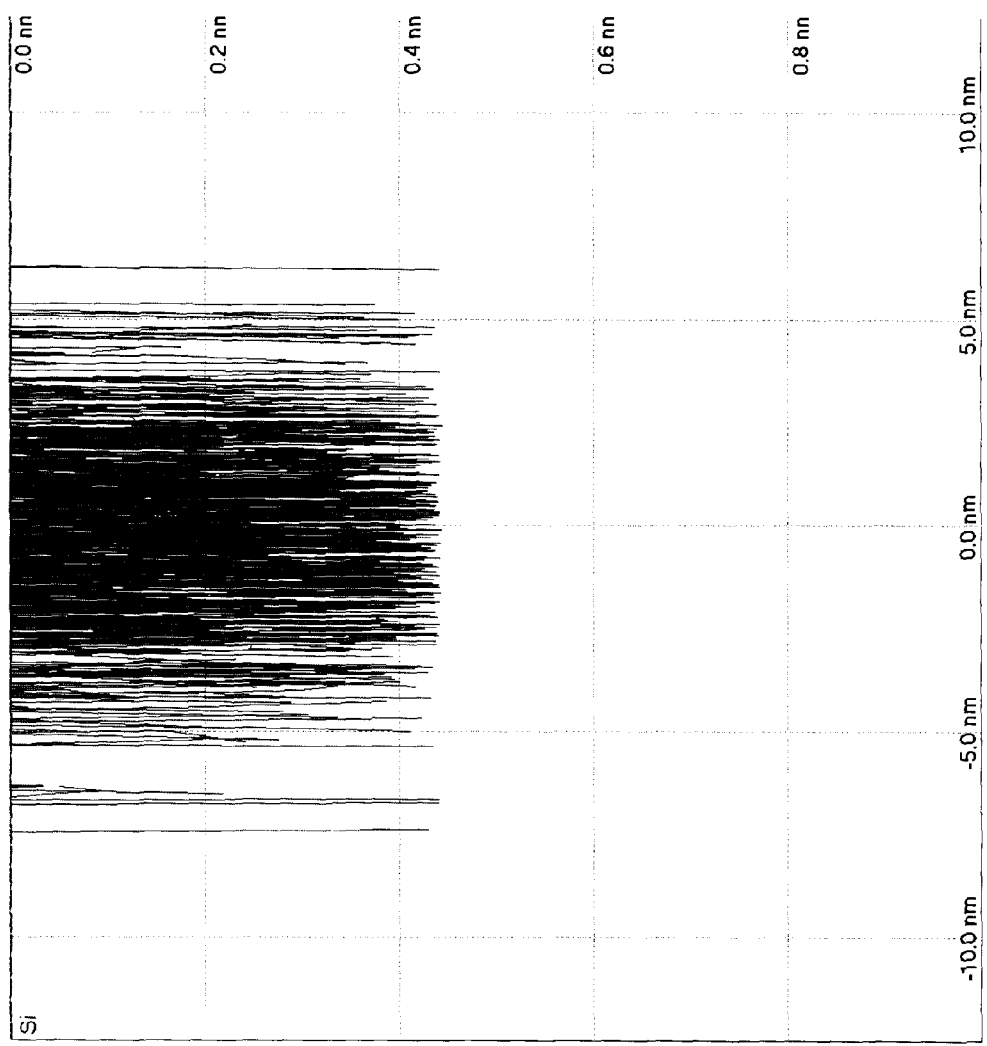

FIG. 8 shows a simulation of a 50 V electron beam having a 10 nm beam diameter incident on the target surface. The horizontal scale is 5 times smaller than in FIG. 4, and the same simulation parameters have been applied, but the vertical scale is 20 times smaller than shown in FIG. 4 to allow for improved visualization at this very low landing energy. In FIG. 8, the region of re-emitted electrons, all of which could cause gas decomposition, is less than 15 nm wide.

Therefore as shown in the simulations of FIGS. 3 to 5, landing energies greater than 100V and narrow beam diameters will result in regions of re-emitted electrons that many times larger than the beam diameter. Since the re-emitted electrons can react with etchant gas, larger areas of the silicon will be unintentionally etched. The detrimental effect of this is clearly shown in FIGS. 9a and 9b.

Figure 9A:
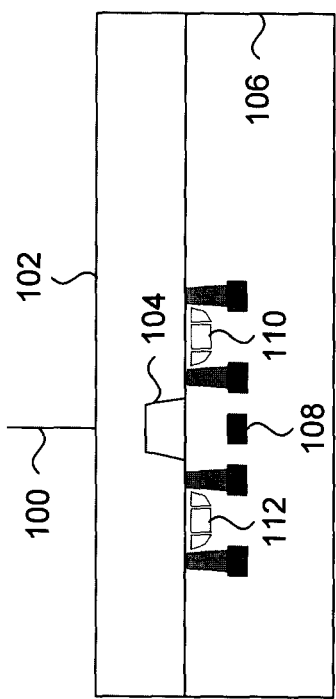
FIGS. 9a and 9b are illustrations of high interaction volume effects during a circuit edit operation using a high landing energy electron beam.
Figure 9B:
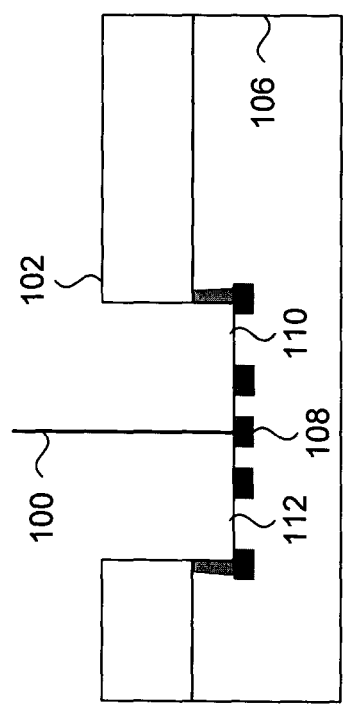

FIGS. 9a and 9b shows the effect of a high landing energy electron beam 100 on a silicon substrate 102 in the presence of an etch gas, for a circuit edit etching operation through the backside of a semiconductor device. More specifically, the desired result is to burrow a narrow hole through the substrate 102, the intervening shallow trench isolation 104, and the insulating material 106, to expose a metal line 108 positioned between two transistors 110 and 112. In the present example, the landing energy is about 2000V, and the beam diameter is about 1 nm. FIG. 9a shows the semiconductor device structure as the electron beam strikes the surface of substrate 102. FIG. 9b shows the resulting approximate opening delineated by the large interaction volume, as simulated in FIG. 3. As shown in FIG. 9b, the adjacent transistor structures 110 and 112 are etched away, despite the 1 nm diameter of incident beam 100.

Therefore, the discovery that sub-100V electron beam landing energies used, even with broader beam diameters, can be used for increasing etch accuracy in the same operation of FIGS. 9a and 9b above. An embodiment of the low landing energy etching technique is shown in FIGS. 10a and 10B.

Figure 10A:
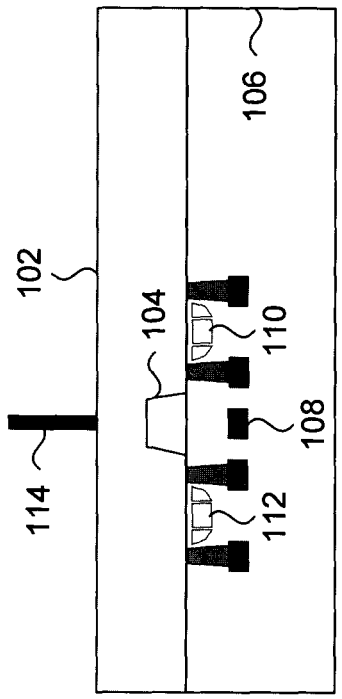
FIGS. 10a and 10b are illustrations of low interaction volume effects during a circuit edit operation using a low landing energy electron beam, according to an embodiment of the present invention.
Figure 10B:
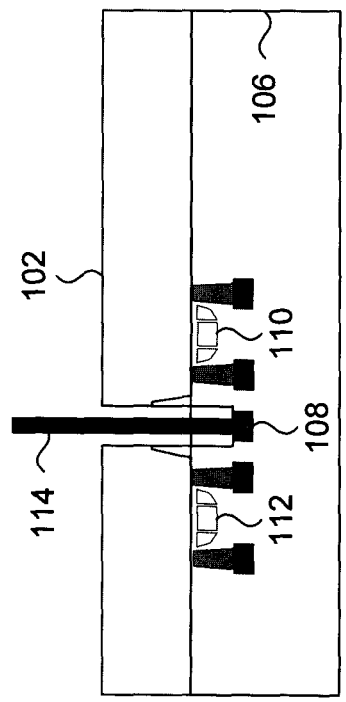

FIGS. 10a and 10b shows the effect of a low landing energy electron beam 114 on a silicon substrate 102 in the presence of an etch gas, for the same circuit edit etching operation of FIGS. 9a and 9b. In this example, the landing energy of the beam 114 is 99V, but the beam diameter is broadened to 10 nm. FIG. 10b shows the resulting approximate opening delineated by the relatively low interaction volume, as simulated in FIG. 7. As shown in FIG. 10b, high accuracy is obtained as none of the adjacent transistor structures 110 and 112 are etched, and only the desired metal line 108 is exposed.

By example only, a low landing energy of 50V can be used for gas assisted electron beam etching, with the same or better result than shown in the embodiment of FIGS. 10a and 10b. The advantage of using these very low landing energies is the fact that (a) the energies of the primary beam approach that of the secondary electrons emitted by the SEM (or FIB) and are therefore in the "sweet spot" of energies required for ion or electron based gas processes and (b) the energy of the primary beam is low enough that the interaction volume of the beam is very small and the transit volume through which the primaries and their emitted secondaries pass is very small. This will assist in maintaining a very localized gas process, which is known to be an issue when attempting SEM gas chemistries at conventional landing energies of 100 V and above. Thus going down to very low landing energies from just above "negative" (reflecting) to less than 100 V while still maintaining good spatial resolution has numerous advantages for the field of circuit editing and other electron initiated gas processes and techniques.

Those skilled in the art will understand that different gases will disassociate most efficiently at specific electron beam energies. These values are well known in the art, therefore the specific low landing energy to use will depend on the type of gas being used. Therefore, according to the embodiments of the present invention, landing energies under 100V and optimal for disassociating a specific gas, can be used for electron beam etch and deposition operations.

According to further embodiments of the present invention, low landing energies near the operating voltage of the semiconductor devices being worked on can be used for improving imaging, and hence navigation by an SEM operator. This can be done through semiconductor circuit front-side or back-side irradiation by the low landing energy electron beam, and then observing the voltage contrast between differently doped regions of the device. Those skilled in the art will understand that the aforementioned high accuracy circuit editing operations are achievable if the beam can be positioned in the desired location. This usually requires an SEM operator to visually navigate about a surface area image of the semiconductor device, and identify landmarks or structures as reference points.

Figure 11:
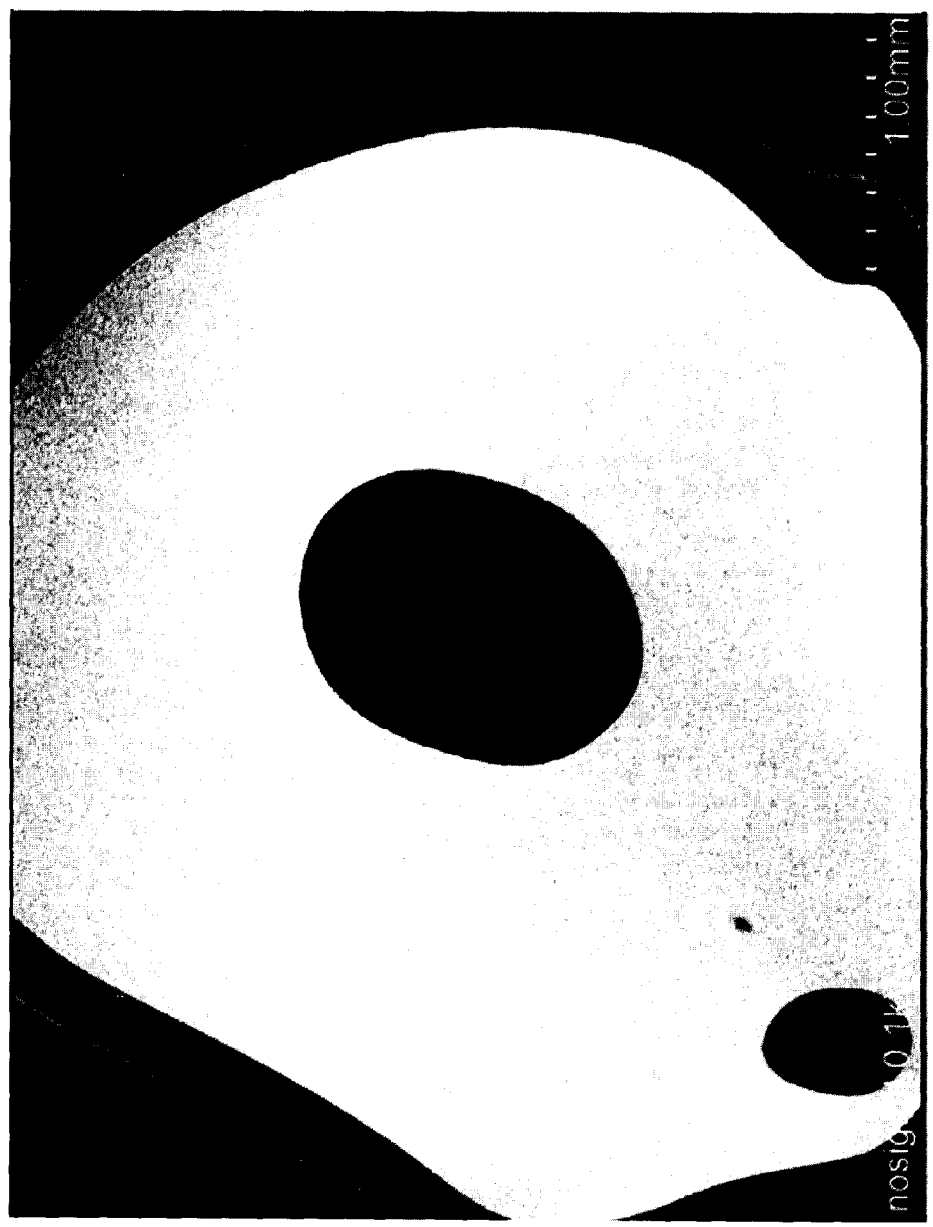
FIG. 11 is an image of a bottom of an SEM column due to negative landing energy.

Such low landing energies can be achieved through a variety of means. For example, the deceleration circuits of a commercial FESEM machine can be adjusted such that the landing energy is set between just above a negative landing energy to 99V. Alternately, field inducing elements can be inserted proximate to the surface of the sample and the electron beam, for slowing down the primary electrons. Any person skilled in the art will be able to calibrate the field strength of the field inducing element with the desired final landing energy. Experiments have shown that negative landing energies are achievable, such that the electrons are reflected back up, resulting in an image of the bottom of the electron column being formed. More specifically, the primary electrons never hit the surface of the sample, and instead return as mirror electrons. FIG. 11 is an image resulting from landing energies of about −5V, where electrons are turned around (mirrored) to image the bottom of the SEM column.

Figure 12:
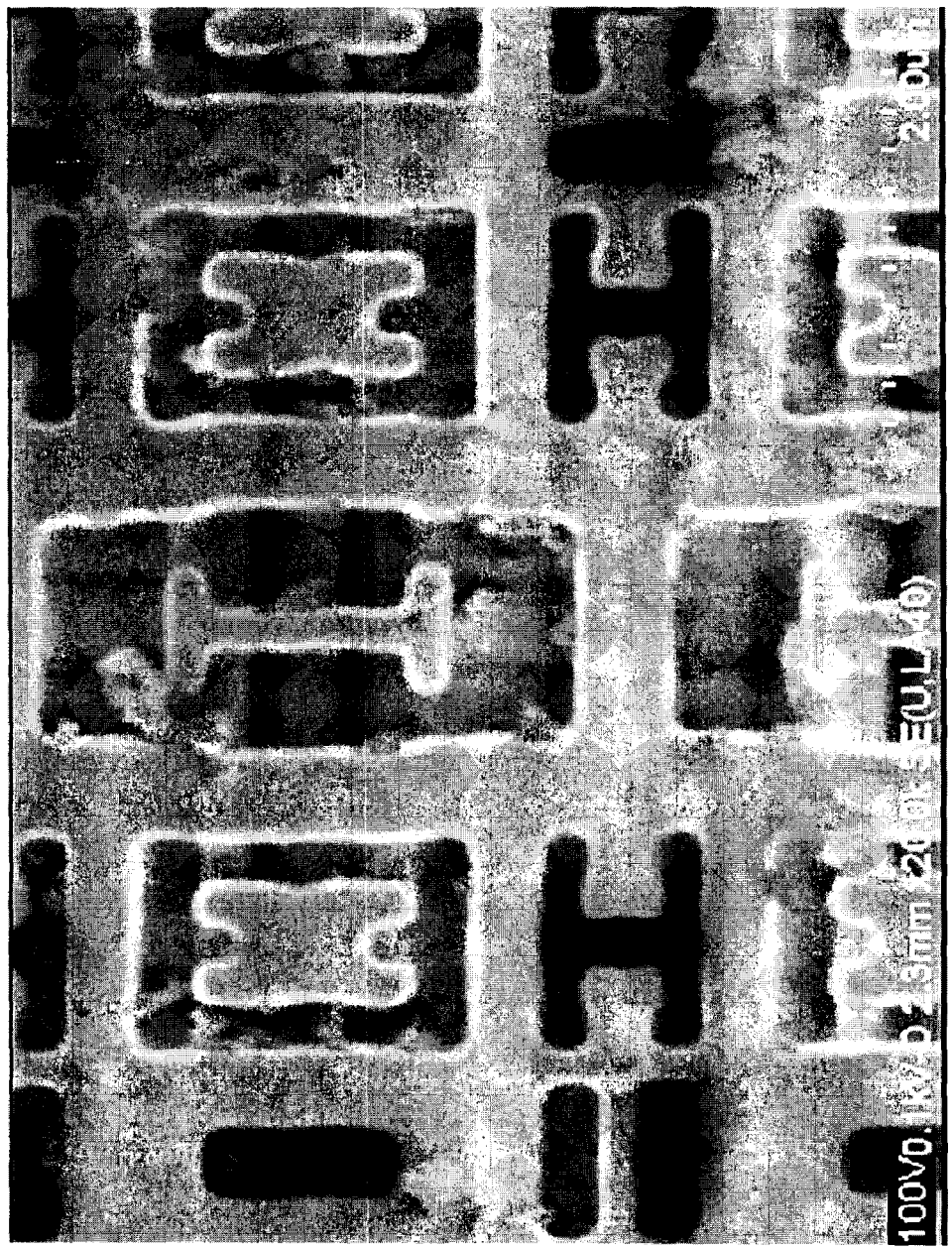
FIG. 12 is an SEM image of an integrated circuit using a 100V landing energy.
Figure 13:
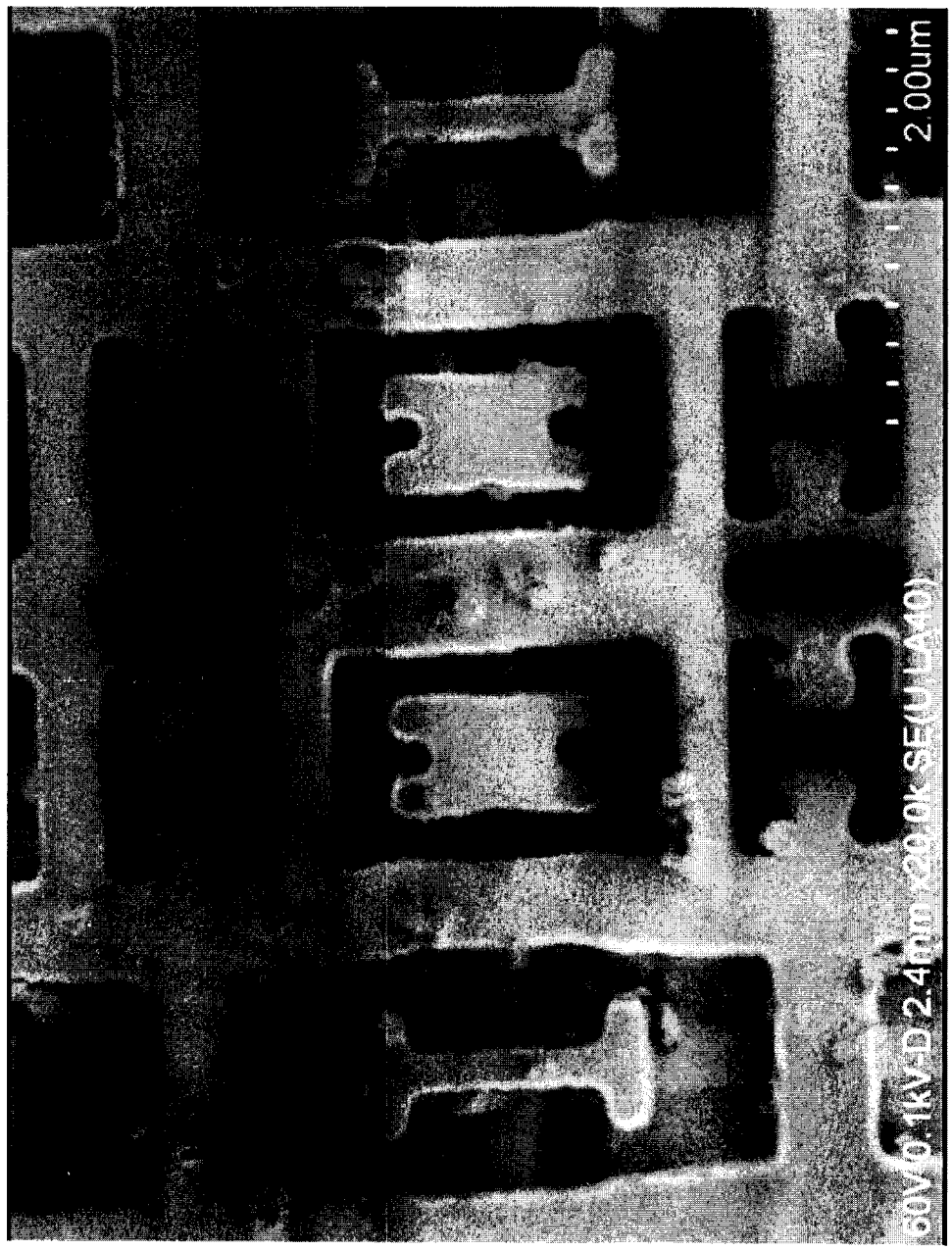
FIG. 13 is an SEM image of an integrated circuit using a 60V landing energy.

By way of contrast, the result of using sub-100V landing energies can be seen in a comparison with an SEM image of a semiconductor circuit using a 100V landing energy. FIG. 12 shows an image generated using the commercially available minimum 100 V landing energy of a region of an integrated circuit. FIG. 13 on the other hand, is an image of the integrated circuit using the same detector settings as in FIG. 12, when the landing energy is lowered to 60V by overcorrecting the deceleration circuitry calibration. FIG. 13 clearly shows a greatly increased contrast in the resultant image signal relative to the image of FIG. 12.

It has been discovered that as the landing energies are decreased to about 9 V and then to 4V, the beam resolution will be slightly impacted but the level of detail will be greatly enhanced. At these low landing energy levels, voltage contrast effects become evident and pronounced, becoming particularly sensitive to regions of the device with different doping levels or types. This is mainly due to the fact that the semiconductor devices are designed and fabricated for low operating voltages (such as 1.8V to 5V for example), and their doped regions will react differently in the presence of the low landing energy electrons. This sensitivity can be induced even through intervening layers of insulating or semi-conducting materials.

Therefore, according to an embodiment of the present invention, troubleshooting analysis, or navigation, of a semiconductor circuit can be obtained by maintaining a stable landing energy that can be finely controlled while an active or passive device is examined. The landing energy can be maintained by feedback and control means between the accelerating and/or decelerating systems of the FESEM machines.

Therefore, due to the resulting passive voltage contrast, imaging of an unpowered device can assist in failure analysis or navigation. Because an active device can be examined, the operator can visually see where certain areas of the semiconductor circuit is dynamically switching between states. In other words, by maintaining the landing energy near the operating voltage of the device, it is possible to see various regions that switch on or off, either reflecting the electrons or allowing them to land, thereby giving a greatly enhanced voltage contrast. It may not be necessary to actually reflect the electrons; merely varying the landing energy near the operating voltage will likely have a significant effect on the electron signal. A significant advantage of using landing energies near the operating voltage of the devices, is that the probability of electrostatic discharge (ESD), which can damage the device, will be greatly reduced.

Figure 14:
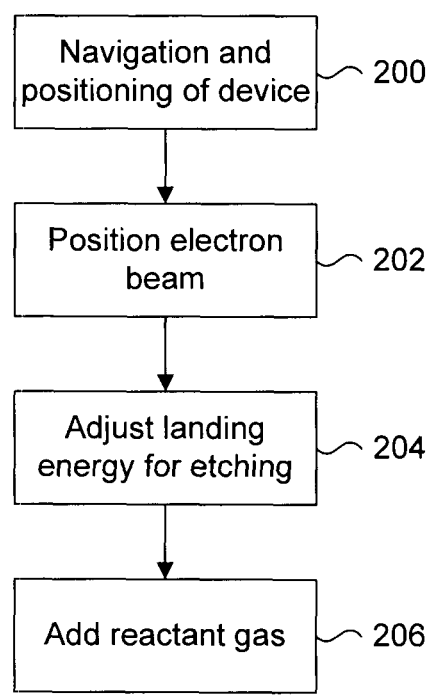
FIG. 14 is a flow chart illustrating a circuit edit method using low landing energy electron beams, according to an embodiment of the present invention.

FIG. 14 is a flow chart illustrating a method of performing a circuit edit operation, according to an embodiment of the present invention. A circuit edit operation refers to an etching of material or deposition of material. The method starts at step 200 where an operation navigates to position the beam for the circuit edit operation. This can include using an electron beam having a low landing energy below 100V According to the previously discussed embodiments, portions of the semiconductor device can be powered up or grounded, or the device can remain unpowered. Thus it is possible to induce voltage contrast that will be visible through intervening layers, such as those that separate the conductive regions from the exposed surface as seen during semiconductor circuit editing, thereby providing excellent navigation references. Alternately, high landing energies can be used, or any suitable navigation technique can be used. The operator can then position the electron beam onto a specific target area for a circuit edit operation at step 202. At step 204, the landing energy can be set to any level below 100V in preparation for the circuit edit operation. An appropriate etching gas can be provided at step 206 to commence gas assisted etching/deposition using the electron beam.

If a landing energy used in step 200 is different than in later step 204, those skilled in the art will understand that position and field of view correction may be necessary. It is noted that steps 204 and 206 do not have to be performed in the listed sequence, and that circuit edit parameters can be preset for operating the beam. FIB pre-processing or post-processing can be used with the steps of the present method.

It is noted that only steps 200 and 202 can be executed, while an FIB can then be used for milling the target area. Alternately of course, only steps 204 to 206 can be executed if the standard>100V SEM imaging, or FIB or other navigating means is sufficient for determining the target area to be etched.

As previously described, the low landing energies of the electron beam can be achieved by controlling the deceleration system of the native FESEM machine. In another alternate embodiment, a field inducing element can be used for slowing down the primary electrons. This can be achieved using the novel gas nozzle of FIGS. 15a, 15b and 15c.

FIGS. 15a, 15b and 15c are schematics showing a novel gas nozzle according to an embodiment of the present invention. This novel gas nozzle design provides high gas flux at the sample surface, and includes a large escape angle for secondaries and reduced gas flux in the beam path between the column and the bottom of the nozzle.

FIG. 15a is a planar view of a gas nozzle 300 according to an embodiment of the invention, while FIG. 15b shows a cross-sectional end view along line A-A and FIG. 15c shows a cross-sectional side view along line B-B. Gas nozzle 300 includes a hollow body 302 with a gas inlet 304 for receiving reactive and/or non-reactive gasses, and a frusto-conically shaped hole 306 extending through hollow body 302. Aperture 306 is defined by a top opening 308 having a first area and a bottom opening 310 having a second area, where the second area is smaller than the first area. For circuit edit operations for example, the second area can be about 200 μm×200 μm square. While the present embodiment uses circular shaped openings, any shaped opening can be used as long as it provides a uniform gas flow and is effective for providing a uniform field gradient if it was biased. The advantage of the slanted sidewalls extending to the bottom side of hollow body 302 provides a large escape angle for ejected secondaries to pass through from the sample and to the detector of the FIB apparatus.

The bottom side of hollow body 302 includes a gas outlet orifice 312, shaped as a ring immediately adjacent to bottom opening 310 and a continuous bottom edge 314 of hollow body 302. Gas received from the inlet 304 is delivered to the sample through orifice 312. An advantage of the ring shape of gas outlet orifice 312 is that it provides a high degree of cylindrical symmetry to the gas flow. The angled side-walls allow the cone of light for an optical microscope objective or a Scwarzschild lens to enter/exit, as well as allowing two beams from two columns to both enter the target site. In a further embodiment, a gas guiding structure can be integrated into the bottom edge 314, such as an "O"-shaped ring. The ring can be configured as a sleeve extending from the bottom edge 314 and surrounding gas outlet aperture 312.

The hollow body 302 has a reservoir volume formed by the capped end 316, beyond the gas outlet orifice 312. The arrows "turning around" in FIG. 15a illustrate the gas flow to the orifice 312. The openings in the hollow body 302 on either side of the a frusto-conically shaped hole 306, along the line A-A, are sufficiently large to allow essentially unimpeded gas flow past the frusto-conically shaped hole 306, so the pressure on the gas input end 304 side and the closed capped end 316 is substantially the same. Those skilled in the art will understand that the geometric design parameters of nozzle 300 for meeting this critera can be determined using known techniques. Therefore, the gas flow out of the orifice 312 from all sides is constant. The desired result is to obtain a uniform gas flow that is even from all sides, maintaining a high, uniform gas flux at the surface of the sample without exposing the incoming primary particle to a long, high gas flux path. The angle of the frusto-conically shaped aperture 306 is at least the angle between two columns such that (a) a second charged particle beam from a so-called dual column instrument would also have line of site to the target area when the gas nozzle 300 is in place, and (b) the optical "cone" required to perform optical imaging on the sample is not compromised while the gas nozzle 300 is inserted.

FIGS. 16a, 16b and 16c are schematics showing an alternate gas nozzle according to an embodiment of the present invention. This alternate gas nozzle 400 is similar to gas nozzle 300 shown in FIGS. 15a, 15b and 15c, and consists of the same numbered features previously described for gas nozzle 300. Gas nozzle 400 includes the following modifications to the design of gas nozzle 300. The bottom edge 402 is raised relative to the bottom of gas outlet aperture 312 and relative to the bottom edge 314 of gas nozzle 300. Alternatively, the conical wall of frusto-conically shaped aperture 306 can be extended past the bottom edge 402.

By raising the bottom edge or extending the frusto-conically shaped aperture 306, clearance is provided such that the gas nozzle 400 will not come into contact with structures, such as bond wires, which may extend from the sample surface. Therefore, gas nozzle 400 can be positioned anywhere on a sample with high versatility. In yet a further alternate embodiment, the bottom edge 402 can be raised to the position shown by dashed lines 406 to achieve the same effect. While the illustrated hollow body 302 is shown as being parallel to an underlying sample, the hollow body 302 can be angled upwards and away from sample surfaces to further facilitate clearance of structures.

Furthermore, a conical side-wall 404 can be added such that it is concentric with the conical wall of frusto-conically shaped aperture 306. Conical side-wall 404 and the conical wall of frusto-conically shaped aperture 306 cooperate to form a channel for guiding gas to the gas outlet aperture 312. Preferably, the channel will provide a uniformly directional flow of gas towards the sample. In the presently shown example, conical side-wall 404 is angled such that the distance from the conical wall of frusto-conically shaped aperture 306 is constant. In an alternate embodiment, the conical side-wall 404 can be angled such that the distance from the conical wall of frusto-conically shaped aperture 306 decreases as gas approaches the mouth of gas outlet aperture 312.

This optical cone is significant for apparatus such as a Credence Systems Corporation OptiFIB, which has a Schwarschild optical lens collinear with the ion column. Furthermore, there is no optical distortion caused by standard nozzles inserted into the field of view of the lens. Preferably, the cone angle great enough that it does not impede the optical image or the line of site from a second column. Furthermore, the relatively large cone angle facilitates access to the sample through the use of a nanomanipulator, for example for probing the device. The nanomanipulator can also hold a detector or position a focusing element proximate to the target area while the gas nozzle 300 (or 400) is in place and in use.

According further alternate embodiments, this nozzle can be shaped with the appropriate geometry and electrically biased to provide a concentric electric field, for providing a final deceleration of the electrons from a primary electron beam. For example, a 200 eV incident electron can be decelerated by a 150 V bias of the nozzle, to provide a 50 V landing energy while maintaining the improved properties of the higher energy electron though the bulk of its flight path. In order to counter re-absorption of secondary particles by the sample, the gas nozzle 300 and the sample can be biased, relative to the incoming electron, to slow down an electron and accelerate secondary electrons away from the surface and out to a detector.

In further alternate embodiments, elements on the nozzle, alone or in combination with substrate biasing, can focus the secondary particles towards a detector. It is noted that the nozzle itself can be used as a detector by integrating detector elements, such as diodes to the bottom edge 402, in a way similar to the Nordlys II detector sold by HKL Technology. Alternately, the a portion of or the entire bottom edge 402 can be implemented as a detector.

Figure 17:
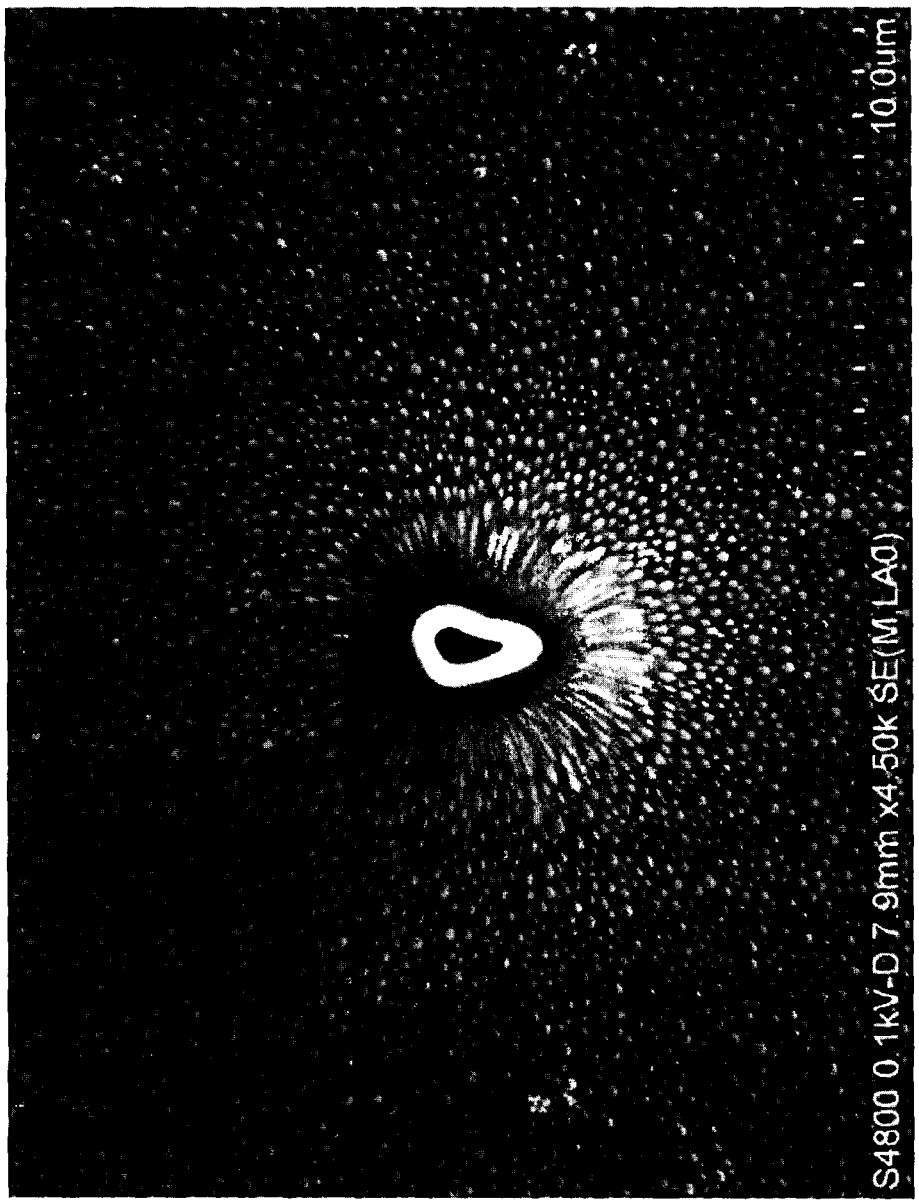
FIG. 17 is an image showing deflection of electrons due to the use of a low landing energy electron beam and charging of a semiconductor device.

As FIG. 17 shows, once the landing energy is very low, local variations in the conductivity can cause the device to charge up locally and deflect the incident beam or secondaries from their typical trajectory. One approach to reduce or eliminate this effect is to locally apply a thin conductive layer using the SEM or FIB that reduces all charge related drift/distortion while processes with a requirement for high spatial resolution occur. One example of such a high spatial resolution process is deposition or etching for circuit editing in a 90 nm semiconductor process. Once all processes with high spatial resolution requirements have been completed one then removes this conductive layer.

By way of example, it has been shown that when a device is susceptible to charging in a given area, say 50 μm×50 xμm, a FIB system can be used to deposit a few nanometers of tungsten over this area. The tungsten may or may not be electrically connected to an opening in the device whereby the tungsten can be electrically grounded. Circuit edit operations are then performed (taking care that the presence of the tunsten layer causes no ill effects in terms of shorting, locally removing portions of the layer in the region of the circuit edit operations if required), after which the locally deposited few nanometers of tungsten may be removed. Note that it may be preferable to first deposit an insulating layer using a non high spatial resolution process, then the conductive layer using a non high spatial resolution process, with appropriate connections to allow for conduction, then perform the high spatial resolution process, selectively strip off the conductive layer, while either leaving or also removing the insulating layer. In backside circuit edit of some devices, it may be that inside the trench that allows access to the region near the devices to be edited, the deposited layer that insulates the trench may be made sufficiently leaky to avoid this charge up and distortion problem while still meeting the required electrical isolation for the circuit edit.

Figure 18:
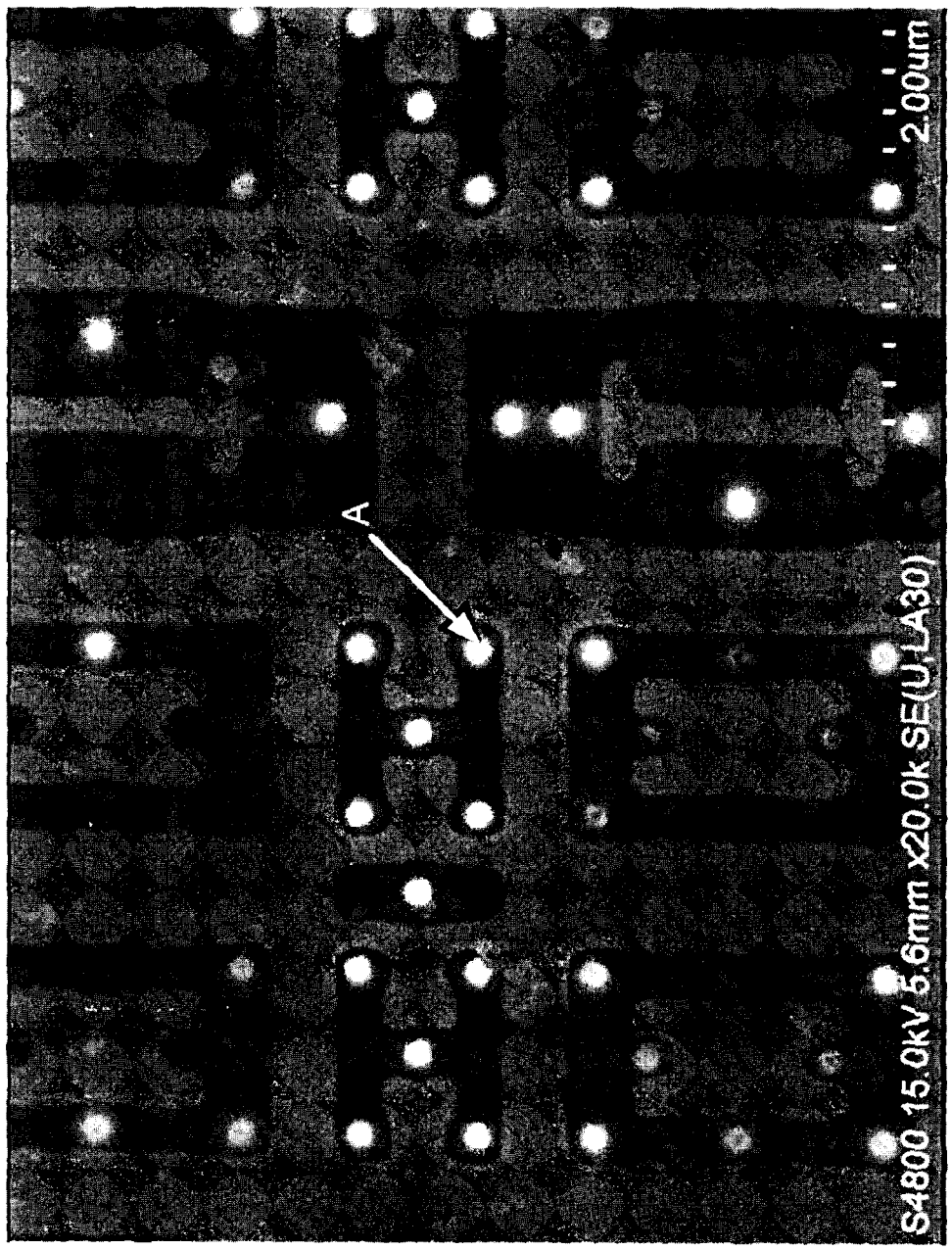
FIG. 18 is an SEM image of an integrated circuit using an electron beam at 15 kV; and, FIG. 19 is an SEM image of an integrated circuit using an electron beam at 30 kV.
Figure 19:
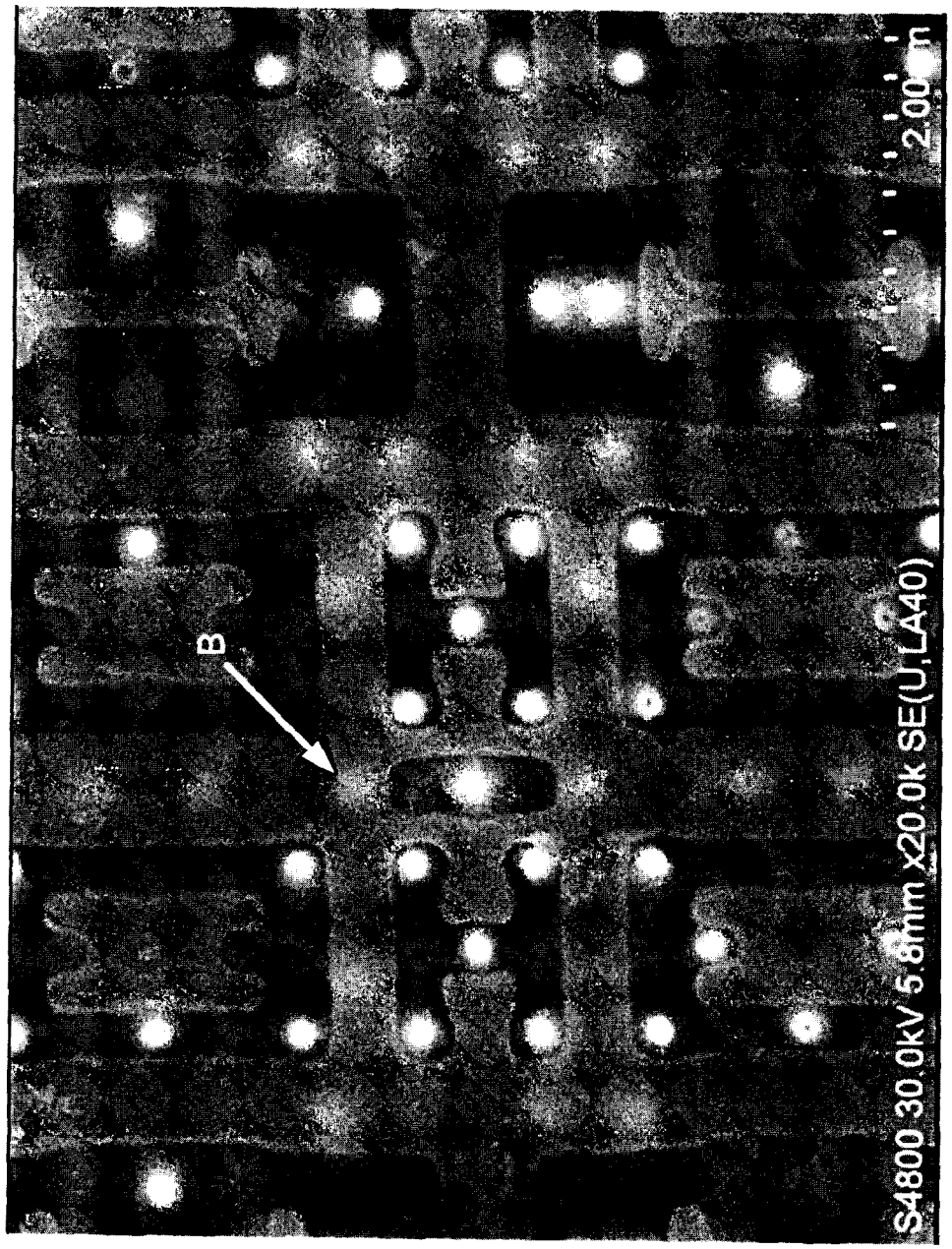

The previously described embodiments of the present invention utilize low landing energies for improving SEM imaging. In an alternate embodiment, high landing energies can be used for imaging buried structures of the semiconductor device. The resultant backscattered electron signal, which can penetrate through a considerable distance, can be examined. By example, FIGS. 18 and 19 show the effect of examining backscattered electrons at 15 kV and 30 kV landing energy.

The 15 kV landing energy used in FIG. 18 produces bright "circles" of tungsten contacts sitting below the surface, one being annotated with reference letter "A". It is noted that these contacts do not appear in the images of FIG. 12 or 13. The 30 kV landing energy used in FIG. 19 begins to show another deeper level of tungsten contacts, one being annotated with the reference letter "B". Viewing through material using backscattered electrons, either with a dedicated backscatter detector or a general electron energy filter (such as an ExB filter used for the images of FIGS. 18 and 19) aids in circuit edit navigation. "Band pass" energy filtering such signals will also yield information as to the mass-thickness of the intervening material and the material causing the backscatter event.

The previously described embodiments of the invention are directed to FESEM systems, but can be used in dual beam systems. In a dual beam system, the FIB and low energy primary electron beams can be used together.

The above-described embodiments of the present invention are intended to be examples only. Alterations, modifications and variations may be effected to the particular embodiments by those of skill in the art without departing from the scope of the invention, which is defined solely by the claims appended hereto.

The invention claimed is:

1. A method for performing a beam rastering operation on a substrate using a charged particle beam, comprising:
    a) directing the charged particle beam emitted from a beam generating column with a first energy level to a target area of the substrate; and,
    b) positioning an electrically biased element external to the beam generating column, proximate to the substrate to provide an electric field for reducing the first energy level of the charged particle beam to a second energy level less than the first energy level.

2. The method of claim 1, wherein the second energy level of the charged particle beam is set to have an optimized energy for disassociating a reactive gas.

3. The method of claim 1, wherein the second energy level of the charged particle beam is set to be less than 1000V.

4. The method of claim 1, wherein the second energy level of the charged particle beam is set to be less than 100V.

5. The method of claim 1, wherein the second energy level of the charged particle beam is less than 2000V.

6. The method of claim 1, wherein the electrically biased element is configured to provide an approximately concentric electric field.

7. The method of claim 1, further including providing a reactive gas proximate to a surface of the substrate.

8. The method of claim 7, wherein the electrically biased element includes a gas nozzle for delivering the reactive gas to the surface of the substrate.

9. The method of claim 8, wherein positioning includes moving an aperture of the gas nozzle over the target area of the substrate and directing the charged particle beam through the aperture.

10. The method of claim 9, wherein providing the reactive gas includes delivering the reactive gas through the gas nozzle to provide an approximately uniform gas flux at the surface of the target area.

11. A method for reducing a landing energy of a charged particle beam emitted from a charged particle beam generating column with an initial energy level, comprising:
    positioning a beam energy reducing element between the beam generating column and a substrate and proximate to the charged particle beam; and
    electrically biasing the beam energy reducing element to provide an electric field for decelerating the charged particle beam, the decelerated charged particle beam having a landing energy level less than the initial energy level.

12. The method of claim 11, wherein the beam energy reducing element includes a nozzle, the method further including injecting a reactive gas proximate to a surface of the substrate from the nozzle.

13. The method of claim 12, wherein the beam energy reducing element includes an aperture, and positioning includes moving the beam energy reducing element for enabling the charged particle beam to pass through the aperture.

14. The method of claim 13, wherein injecting includes providing gas from a gas outlet orifice surrounding the aperture.

* * * * *